United States Patent
Yun et al.

(10) Patent No.: US 9,787,232 B1
(45) Date of Patent: Oct. 10, 2017

(54) APPARATUS AND METHOD FOR CONTROLLING A RIPPLE CURRENT SENSING MOTOR

(71) Applicants: HYUNDAI MOTOR COMPANY, Seoul (KR); OMRON AUTOMOTIVE ELECTRONIC KOREA CO., LTD., Gyeonggi-do (KR)

(72) Inventors: Jeong Gi Yun, Seoul (KR); Dong June Song, Anyang-si (KR); Hun Joung Yoon, Suwon-si (KR); Hee Sung Jang, Suwon-si (KR); In Cheol Ryu, Seoul (KR)

(73) Assignees: Hyundai Motor Company, Seoul (KR); Omron Automotive Electronic Korea Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/263,049

(22) Filed: Sep. 12, 2016

(30) Foreign Application Priority Data

May 23, 2016 (KR) .......................... 10-2016-0063024

(51) Int. Cl.
| | |
|---|---|
| G05B 5/00 | (2006.01) |
| H02H 7/08 | (2006.01) |
| H02P 1/04 | (2006.01) |
| H02P 7/00 | (2016.01) |
| G01R 19/04 | (2006.01) |

(52) U.S. Cl.
CPC ............ *H02P 7/0094* (2013.01); *G01R 19/04* (2013.01)

(58) Field of Classification Search
CPC .............................. H02P 7/0094; G02R 19/04
USPC ........................................................ 318/474
See application file for complete search history.

(56) References Cited

U.S. PATENT DOCUMENTS

| | | | | |
|---|---|---|---|---|
| 2007/0273363 | A1* | 11/2007 | Kurimoto | ............ H02P 7/0094 324/177 |
| 2008/0272726 | A1* | 11/2008 | Buhlheller | ............ E05F 15/41 318/466 |
| 2011/0270558 | A1* | 11/2011 | Knezevic | ................. G01P 3/44 702/65 |

FOREIGN PATENT DOCUMENTS

| | | |
|---|---|---|
| JP | 2008-228452 | 9/2008 |
| JP | 2009-207236 | 9/2009 |
| JP | 2010-045953 | 2/2010 |
| JP | 2011-109881 | 6/2011 |
| JP | 2014-007804 | 1/2014 |
| JP | 2014-007807 | 1/2014 |

* cited by examiner

*Primary Examiner* — Erick Glass
(74) *Attorney, Agent, or Firm* — Brinks Gilson & Lione

(57) ABSTRACT

Provided are an apparatus and method for controlling a ripple current sensing motor. An apparatus for controlling a ripple current sensing motor may include a first shunt resistor having one end connected to one end of a motor and the other end of the first shunt resistor connected to a ground, a second shunt resistor having one end connected to the other end of the motor and the other end of the second shunt resistor connected to the ground, a first amplifying circuit amplifying a first signal from one end of the motor, a second amplifying circuit amplifying a second signal from the other end of the motor, and a detector detecting a rotation amount and a rotation direction of the motor using a change in voltages of a first detection signal from the first amplifying circuit and a second detection signal from the second amplifying circuit.

7 Claims, 5 Drawing Sheets

APPARATUS AND METHOD FOR CONTROLLING A RIPPLE CURRENT SENSING MOTOR

CROSS-REFERENCE TO RELATED APPLICATION

This application is based on and claims the benefit of priority to Korean Patent Application No. 10-2016-0063024, filed on May 23, 2016, in the Korean Intellectual Property Office, the entire disclosure of which is incorporated herein by reference.

TECHNICAL FIELD

The present disclosure relates to a motor rotation sensing technology, and more particularly, to an apparatus and method for controlling a sensorless type ripple current sensing motor.

In general, a motor is installed in a window, a sun roof, or a seat of a vehicle in order to open and close the same. Such a motor may open or close a window or a sun roof or adjust a position or an angle of a seat according to rotation directions thereof.

Thus, a motor controller includes a hall sensor, an encoder, or a resolver in order to detect forward/backward 25 rotation or a rotation amount of a motor.

Here, however, a related art motor control technology based on a hall sensor, an encoder, or a resolver requires installation of a hall sensor in a vicinity of a motor. Therefore, a related art motor control technology results in complication of wiring due to wires for connecting the hall sensor and a controller thereof, as well as a motor and a motor controller.

SUMMARY

The present disclosure has been made to address the above-mentioned problems occurring in the prior art while advantages achieved by the prior art are maintained intact.

An aspect of the present disclosure provides an apparatus and method for controlling a ripple current sensing motor capable of sensing rotation of a motor using a ripple current generated when the motor is driven.

Technical subjects of the present disclosure are not limited to the foregoing technical subjects and any other technical subjects not mentioned herein may be clearly understood by a person skilled in the art from the present disclosure described hereinafter.

In exemplary form of the present disclosure, an apparatus for controlling a ripple current sensing motor includes: a first shunt resistor having one end connected to one end of a motor and the other end of the first shunt resistor connected to a ground; a second shunt resistor having one end connected to the other end of the motor and the other end of the second shunt resistor connected to the ground; a first amplifying circuit configured to amplify a first signal from one end of the motor; a second amplifying circuit configured to amplify a second signal from the other end of the motor; and a detector configured to detect a rotation amount and a rotation direction of the motor using a change in voltages of a first detection signal from the first amplifying circuit and a second detection signal from the second amplifying circuit.

When motor power is applied, the detector may detect inflection points of the first and second detection signals, check a rotation direction of the motor using a signal having Vpp which has been changed to be equal to or greater than a preset magnitude, among the first and second detection signals, and check a rotation amount of the motor by counting the number of generations of a preset period of the signal in which the Vpp is changed.

When it is detected that the motor power being applied is cut off, the detector may detect the rotation amount of the motor by further counting the number of preset periods of the first or second detection signal when a difference between voltages of the first and second detection signals is equal to or greater than a preset threshold value.

In other exemplary forms of the present disclosure, a method for controlling a ripple current sensing motor by a detector of an apparatus for controlling a ripple current sensing motor including a first shunt resistor having one end connected to one end of a motor and the other end of the first shunt resistor connected to a ground, a second shunt resistor having one end connected to the other end of the motor and the other end of the second shunt resistor connected to the ground, a first amplifying circuit amplifying a first signal from one end of the motor, a second amplifying circuit amplifying a second signal from the other end of the motor, and the detector, includes: checking whether power is applied to the motor; and when power is applied to the motor, detecting a rotation amount and a rotation direction of the motor using a change in voltages of the first and second detection signals.

BRIEF DESCRIPTION OF THE DRAWINGS

The above and other objects, features and advantages of the present disclosure will be more apparent from the following 20 detailed description taken in conjunction with the accompanying drawings.

DETAILED DESCRIPTION

Aforementioned aspects and other advantages, features and aspects of the present invention will become apparent from the following description of the forms with reference to the accompanying drawings, which is set forth hereinafter. The present invention may, however, be embodied in different forms and should not be construed as limited to the forms set forth herein. Rather, these forms are provided so that this disclosure will be thorough and complete, and will fully convey the scope of the present invention to those skilled in the art. The terms used herein are for the purpose of describing particular forms only and are not intended to be limiting of exemplary forms. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components thereof.

Figure 1:
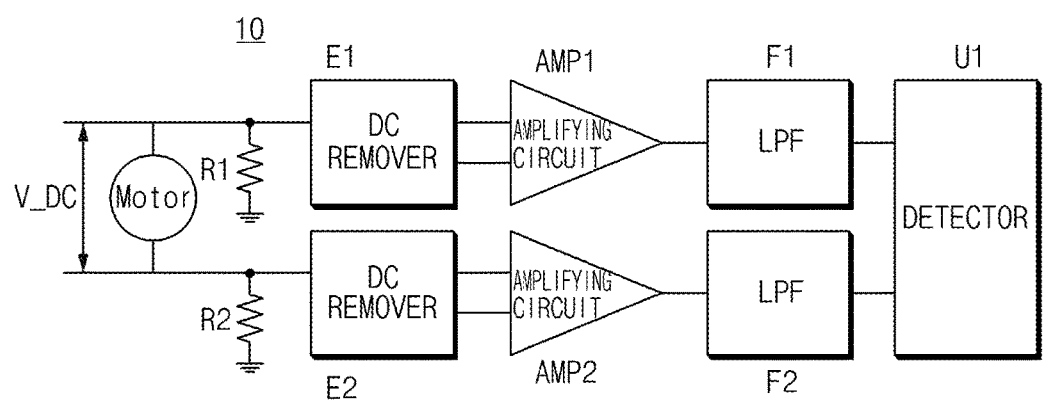
FIG. 1 is a block diagram illustrating an apparatus for controlling a ripple current sensing motor.
Figure 2:
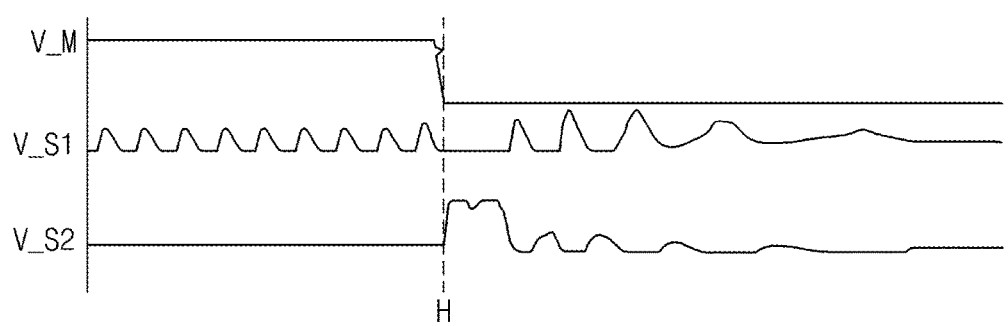
FIG. 2 is a graph illustrating motor power and first and second sensing signals.
Figure 3:
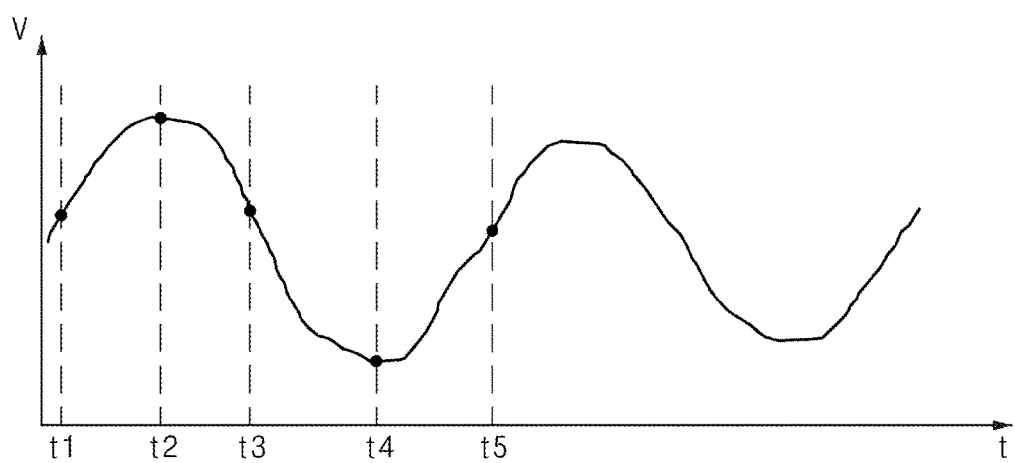
FIG. 3 is a graph illustrating first and second sensing signals when motor power is applied.
Figure 4:
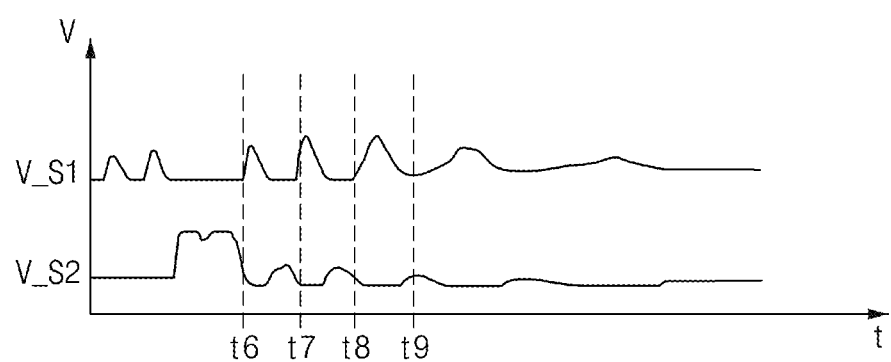
FIG. 4 is a graph illustrating first and second sensing signals in detail when the motor power is applied and subsequently cut off.

Hereinafter, an exemplary form of the present disclosure will be described in detail with reference to the accompanying drawings. FIG. 1 is a block diagram illustrating an apparatus for controlling a ripple current sensing motor; FIG. 2 is a graph illustrating motor power and first and second sensing signals; FIG. 3 is a graph illustrating first and second sensing signals when motor power is applied; and FIG. 4 is a graph illustrating first and second sensing signals in detail when the motor power is applied and subsequently cut off.

As illustrated in FIG. 1, an apparatus 10 for controlling a ripple current sensing motor includes a first shunt resistor R1, a second shunt resistor R2, a first direct current (DC) remover E1, a second DC remover E2, a first amplifying circuit AMP1, a second amplifying circuit AMP2, a first LPF F1, a second LPF F2, and a detector U1.

One end of the first shunt resistor R1 is connected to one end of a motor, and the other end thereof is connected to a ground. Here, the motor may be a motor adjusting a sun roof, a vehicle window, a seat slide, a seat angle, and the like.

When the motor rotates, a commutator and a brush thereof come into contact with each other, generating a current ripple according to a rotation direction thereof.

One end of the second shunt resistor R2 is connected to the other end of the motor, and the other end thereof is connected to a ground.

The first and second shunt resistors R1 and R2 may be resistors having a low error rate to increase accuracy of detection of revolution per minute (RPM) of the motor. For example, the error rate may be 0.1%.

The first and second shunt resistors R1 and R2 may have a high resistance value in order not to interfere with current flowing in the motor. For example, the first and second shunt resistors R1 and R2 may have resistance of 10 kΩ or greater.

The first DC remover E1 removes a DC component from a signal at one end of the motor to generate a first signal (signal corresponding to a ripple of the motor) and transmits the first signal to the first amplifying circuit AMP1.

The second DC remover E2 removes a DC component from a signal at the other end of the motor to generate a second signal and transmits the second signal to the second amplifying circuit AMP2.

For example, the first and second DC removers E1 and E2 may include at least one of filters using a capacitor and an active element (i.e., an operational amplifier (OP AMP)).

In a case in which DC blocking is not necessary in terms of configuration of the first and second amplifying circuits AMP1 and AMP2, the first and second DC removers E1 and E2 may be omitted.

Also, in a case in which the first and second DC removers E1 and E2 are OP AMPs, the first and second DC removers E1 and E2 may simultaneously perform DC removal and amplification. Thus, the first and second DC removers E1 and E2 and the first and second amplifying circuits AMP1 and AMP2 may be respectively integrated into a single circuit element OP AMPS.

The first amplifying circuit AMP1 amplifies the first signal with a first preset amplification factor and transmits the amplified signal to the first LPF F1.

The second amplifying circuit AMP2 amplifies the second signal with a second preset amplification factor and transmits the amplified signal to the second LPF F2. Here, the first and second amplification factors may be the same value so that outputs from the first and second amplifying circuits AMP1 and AMP2 may be compared under the same condition.

For example, the first and second amplifying circuits AMP1 and AMP2 may be OP AMPs advantageous for analog amplification.

The first LPF F1 cancels noise of a high frequency component from an output of the first amplifying circuit AMP1, and transmits a corresponding output to the detector U1.

The second LPF F2 cancels noise of a high frequency component from an output of the second amplifying circuit AMP2, and transmits a corresponding output to the detector U1.

The detector U1 receives a first detection signal V_S1 and a second detection signal V_S2, outputs from the first LPS F1 and the second LPF F2, and checks a rotation direction and a rotation amount of the motor.

Here, the detector U1 may further detect whether power V_M is applied to the motor, and check a rotation direction and a rotation amount of the motor differently when power is applied to the motor and when power is not applied to the motor.

Hereinafter, an example of checking a rotation direction and a rotation amount of the motor by the detector U1 by differentiating a case in which power is applied to the motor and a case in which power supply to the motor is cut off will be described.

When Motor Power is Applied

When motor power is applied, only a voltage of any one of the first detection signal or the second detection signal according to a driving direction of the motor is changed, and a voltage of the other is not changed (please refer to a waveform prior to a time point H of FIG. 2).

Thus, the detector U1 may determine a driving direction of the motor upon checking whether there is a ripple in the first detection signal or whether there is a ripple in the second detection signal.

Also, the detector U1 may detect a rotation amount of the motor by counting a change in a voltage of the first or the second detection signal corresponding to the ripple generated in the motor.

As illustrated in the graph prior to the time point H of FIG. 2 and FIG. 3, any one of the first and second detection signals relatively regularly moves in a form similar to a sine wave, and the other has a voltage value similar to that of a ground.

Thus, the detector U1 detects inflection points, t1 to t5 of the first or second detection signal upon checking a change in voltage of the first or second detection signal having a form similar to the sine wave periodically through an ADC port, or the like.

The detector U1 may count the number of preset periods of the first or second detection signal as one rotation of the motor according to the number of slots of the commutator of the motor, and detect the counted number as a rotation amount of the motor.

For example, in a case in which the number of slots of the motor commutator is 8, the detector U1 may count eight periods of the first or second detection signal as one rotation of the motor.

For example, in a case in which the number of slots of the motor commutator is 4, when the motor rotates ¼, it may generate ripples from t1 to t5 of FIG. 3. In this case, the detector U1 may count four periods of the first or second detection signal as one rotation of the motor.

In another example, in a case in which the number of slots of the motor commutator is 12, when the motor rotates 1/12, it may generate ripples from t1 to t5 of FIG. 3. In this case, the detector U1 may count 12 periods of the first or second detection signal as one rotation of the motor.

When Motor Power is Cut Off

As illustrated in FIG. 4 and waveform after the time point H of FIG. 2, when motor power is cut off, waveforms of the first detection signal and the second detection signal become irregular unlike the case in which motor power is applied.

Thus, the detector U1 detects a signal to be counted by comparing a difference between voltages of the first and second detection signals and inflection points, and detects a rotation amount of the motor using a preset period of the signal to be counted.

For example, only when the difference between voltages of the first and second detection signals is equal to or greater than a preset threshold value, the detector U1 may count the number of one period and detect a rotation amount of the motor. Here, the threshold value is a ripple size with which rotation of the motor may be determined, which may be experimentally determined.

Alternatively, the detector U1 may check inflection points according to a change in a voltage of a difference signal between the first and second detection signals and detect a rotation amount of the motor using a period of the difference signal.

Referring to FIG. 4, the detector U1 may determine a rotation amount of the motor by further counting the number of time durations from t6 to t7, from t7 to t8, and from t8 to t9 in which the difference signal is equal to or greater than the preset threshold value after the motor power is cut off. Also, the detector U1 may detect a total rotation amount of the motor by adding up the period of the first or second detection signal counted when the motor power was applied and four rotations counted when the motor power was cut off. Here, the detector U1 may determine a signal after t9 as noise and may not count the signal.

In this manner, in the present disclosure, since a rotation amount of the motor when motor power is applied is counted and a rotation amount of the motor is counted using only a change in ripples that may be determined as rotation of the motor when motor power is cut off, the rotation amount of the motor may be more accurately detected.

In addition, in an exemplary form of the present disclosure, a circuit member other than a wire connected to the motor may be included in a motor control unit of a vehicle body, whereby a connection structure for sensing the motor may be simplified, and thus, cost for implementing a motor sensing module may be reduced.

Figure 5:
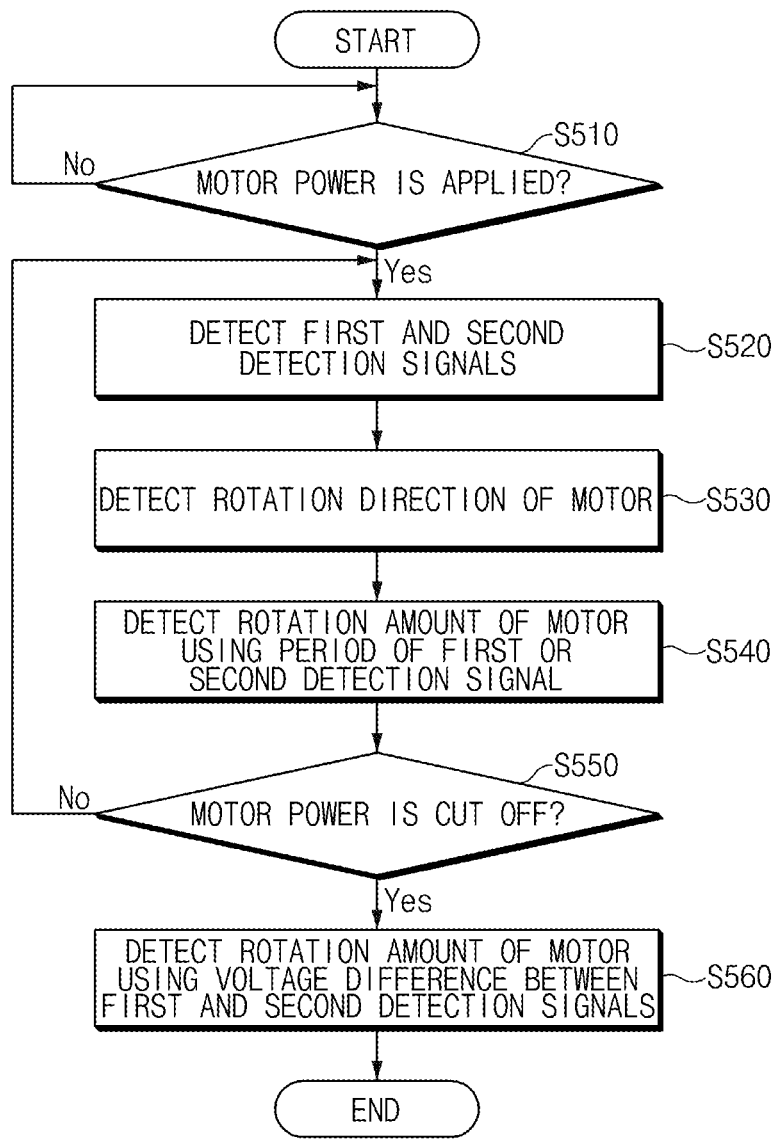
FIG. 5 is a flow chart illustrating a method for controlling a ripple current sensing motor.

Hereinafter, a method for controlling a ripple current sensing motor will be described with reference to FIG. 5. FIG. 5 is a flow chart illustrating a method for controlling a ripple current sensing motor.

Referring to FIG. 5, when motor power is applied (YES in S510), the detector U1 detects first and second detection signals in operation S520.

Thereafter, the detector U1 detects a rotation direction of the motor depending on in which of the first and second detection signals a ripple is generated in operation S530.

For example, when a ripple is generated in the first detection signal, the detector U1 may determine that a rotation direction of the motor is a first direction, and when a ripple is generated in the second detection signal, the detector U1 may determine that a rotation direction of the motor is a second direction.

Also, the detector U1 checks inflection points of the signal in which a ripple is generated, and counts a preset period of the corresponding signal to detect a rotation amount of the motor in operation S540.

Here, the preset period may be determined from the number of ripples according to driving characteristics of the motor, and may be, for example, ½, 1, or 2 periods.

When the detector U1 detects that motor power is cut off (YES in S550), the detector U1 detects a rotation amount of the motor using inflection points of the first and second detection signals and a difference between voltages thereof in operation S560.

In detail, even though inflection points of the first and second detection signals are detected, if a difference between voltages of the first and second detection signals is less than a preset threshold value, the detector U1 may not count a rotation amount of the motor by the inflection point. In this manner, the detector U1 may use only signals in which a difference between voltages is equal to or greater than the threshold value, in calculating a rotation amount of the motor. Also, the detector U1 may calculate a total rotation amount of the motor by adding up the rotation amount counted when motor power was applied and the rotation amount counted when the motor power was cut off.

In this manner, in some exemplary forms of the present disclosure, since the overrun amount of the motor when motor power is cut off after it is applied, as well as when motor power is applied is further detected, a rotation amount of the motor may be more accurately detected.

In addition, in some exemplary forms of the present disclosure, since a circuit member other than a wire connected to the motor is included in a motor control unit of a vehicle body, a connection structure for sensing the motor may be simplified and cost for implementing a motor sensing module may be reduced.

As described above, in exemplary forms of the present disclosure, a wire required for a motor sensing circuit may be reduced.

Hereinabove, although the present disclosure has been described with reference to exemplary forms and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for controlling a ripple current sensing motor, the apparatus comprising:
    a first shunt resistor having a first end connected to one end of the motor and a second end of the first shunt resistor connected to a ground;
    a second shunt resistor having a first end connected to the second end of the motor and a second end of the second shunt resistor connected to the ground;
    a first amplifying circuit configured to amplify a first signal from a first end of the motor;
    a second amplifying circuit configured to amplify a second signal from a second end of the motor; and
    a detector configured to detect a rotation amount and a rotation direction of the motor based on a first detection signal from the first amplifying circuit and a second detection signal from the second amplifying circuit;
    wherein when motor power is applied to the motor, the detector is configured to:
        set the first detection signal as a reference signal when the first detection signal includes a generated current ripple, or set the second detection signal as the reference signal when the second detection signal includes the generated current ripple;

determine a rotation direction of the motor based on whether the first detection signal includes the generated current ripple or the second detection signal includes the generated current ripple;

detect an inflection point in the reference signal;

determine a voltage difference corresponding to the first detection signal and the second detection signal; and when the voltage difference is greater than or equal to a threshold value, determine a rotation amount of the motor by counting a preset period of the reference signal as one rotation of the motor.

2. The apparatus according to claim 1, further comprising:

a first direct current (DC) remover configured to remove a DC component from the first signal and to transmit a corresponding signal to the first amplifying circuit; and a second direct current (DC) remover configured to remove a DC component from the second signal and to transmit a corresponding signal to the second amplifying circuit.

3. The apparatus according to claim 1, wherein the first and second amplifying circuits are configured to remove a DC component from the first and second signals, respectively, and to amplify the corresponding first and second signals.

4. The apparatus according to claim 1, further comprising:

a first filter configured to provide the first detection signal obtained by removing high frequency noise from an output signal from the first amplifying circuit, to the detector; and a second filter configured to provide the second detection signal obtained by removing high frequency noise from an output signal from the second amplifying circuit, to the detector.

5. The apparatus according to claim 1, wherein when it is detected that the motor power being applied is cut off, the detector is configured to detect the rotation amount of the motor by further counting a period of a difference signal between the first and second detection signals equal to or greater than a preset threshold value.

6. A method for controlling a ripple current sensing motor by a detector of an apparatus for controlling a ripple current sensing motor including a first shunt resistor having one end connected to one end of a motor and the other end of the first shunt resistor connected to a ground, a second shunt resistor having one end connected to the other end of the motor and the other end of the second shunt resistor connected to the ground, a first amplifying circuit amplifying a first signal from one end of the motor, a second amplifying circuit amplifying a second signal from the other end of the motor, and the detector, the method comprising:

checking whether power is applied to the motor;

when power is applied to the motor, detecting a rotation amount and a rotation direction of the motor based on a first detection signal from the first amplifying circuit and a second detection signal from the second amplifying circuit by:

setting the first detection signal as a reference signal when the first detection signal includes a generated current ripple, or set the second detection signal as the reference signal when the second detection signal includes the generated current ripple;

determining a rotation direction of the motor based on whether the first detection signal includes the generated current ripple or the second detection signal includes the generated current ripple;

detecting an inflection point in the reference signal;

determining a voltage difference corresponding to the first detection signal and the second detection signal; and when the voltage difference is greater than or equal to a threshold value, determining a rotation amount of the motor by counting a preset period of the reference signal as one rotation of the motor.

7. The method according to claim 6, further comprising:

when it is detected that motor power being applied is cut off, detecting the rotation amount of the motor by further counting a period of a difference signal between the first and second detection signals equal to or greater than a preset threshold value.

* * * * *